(12) United States Patent
Sun

(10) Patent No.: US 6,768,439 B2
(45) Date of Patent: Jul. 27, 2004

(54) D/A CONVERTER FOR CURRENT-DRIVEN TYPE SOURCE DRIVER CIRCUIT IN AM-OLED

(75) Inventor: Wein-Town Sun, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/419,825

(22) Filed: Apr. 22, 2003

(65) Prior Publication Data

US 2004/0100399 A1 May 27, 2004

(30) Foreign Application Priority Data

Nov. 27, 2002 (TW) ......................................... 91134523 A

(51) Int. Cl.$^7$ ................................................. H03M 1/66
(52) U.S. Cl. ........................................ 341/144; 341/153
(58) Field of Search ................................ 341/144, 153, 341/145, 141; 315/169.3

(56) References Cited

U.S. PATENT DOCUMENTS 5,929,798 A * 7/1999 Baek ............................ 341/153
6,061,289 A * 5/2000 Itoh et al. ..................... 365/226
6,369,736 B2 * 4/2002 Tran et al. .................... 341/144
2002/0195968 A1 * 12/2002 Sanford et al. ............ 315/169.3

* cited by examiner

*Primary Examiner*—Brian Young
*Assistant Examiner*—Joseph Lauture
(74) *Attorney, Agent, or Firm*—Troxell Law Office PLLC

(57) ABSTRACT

A D/A converter applied in current-driven type source driver circuits for producing the data current with different gray levels is disclosed. The D/A converter comprise the following components. A column decoder is applied to transform input digital control signals (Dx) to column selecting signals (Cj). A row decoder is applied to transform the digital control signals (Dx) to row selecting signals (Ri). A unit cell array has current cells arranged in array form. Each current cell has a local current source and a local decoder, the local current source is chosen from at least three ones of different current intensity, and the local decoder can decode the column selecting signals and the row selecting signals for deciding to switch on or off the local current source thereof. The output currents of all the current cells switched on are summed up to produce the data current with a selected gray level.

4 Claims, 6 Drawing Sheets

|    | D3 | D2 | D1 | D0 | C1 | C2 | C3 | R1 | R2 | R3 | T1 | T2 | T3 | T4 | T5 | T6 | T7 | T8 | T9 |
|----|----|----|----|----|----|----|----|----|----|----|----|----|----|----|----|----|----|----|----|
| 1  | 0  | 0  | 0  | 0  | 1  | 0  | 0  | 0  | 0  | 0  | 1  | 0  | 0  | 0  | 0  | 0  | 0  | 0  | 0  |
| 2  | 0  | 0  | 0  | 1  | 0  | 1  | 0  | 0  | 0  | 0  | 0  | 1  | 0  | 0  | 0  | 0  | 0  | 0  | 0  |
| 3  | 0  | 0  | 1  | 0  | 1  | 1  | 0  | 0  | 0  | 0  | 1  | 1  | 0  | 0  | 0  | 0  | 0  | 0  | 0  |
| 4  | 0  | 0  | 1  | 1  | 0  | 0  | 1  | 0  | 0  | 0  | 1  | 1  | 1  | 0  | 0  | 0  | 0  | 0  | 0  |
| 5  | 0  | 1  | 0  | 0  | 1  | 0  | 1  | 0  | 0  | 0  | 1  | 1  | 1  | 0  | 0  | 0  | 1  | 0  | 0  |
| 6  | 0  | 1  | 0  | 1  | 0  | 1  | 1  | 0  | 0  | 0  | 1  | 1  | 1  | 0  | 0  | 0  | 0  | 1  | 0  |
| 7  | 0  | 1  | 1  | 0  | 1  | 1  | 1  | 0  | 0  | 0  | 1  | 1  | 1  | 0  | 0  | 0  | 1  | 1  | 0  |
| 8  | 0  | 1  | 1  | 1  | 0  | 0  | 1  | 1  | 0  | 0  | 1  | 1  | 1  | 0  | 0  | 0  | 1  | 1  | 1  |
| 9  | 1  | 0  | 0  | 0  | 1  | 0  | 1  | 0  | 1  | 0  | 1  | 1  | 1  | 1  | 0  | 1  | 1  | 0  | 0  |
| 10 | 1  | 0  | 0  | 1  | 0  | 1  | 1  | 0  | 1  | 0  | 1  | 1  | 1  | 1  | 0  | 1  | 0  | 1  | 0  |
| 11 | 1  | 0  | 1  | 0  | 1  | 1  | 1  | 0  | 1  | 0  | 1  | 1  | 1  | 1  | 0  | 1  | 1  | 1  | 0  |
| 12 | 1  | 0  | 1  | 1  | 0  | 0  | 1  | 1  | 1  | 0  | 1  | 1  | 1  | 1  | 0  | 1  | 1  | 1  | 1  |
| 13 | 1  | 1  | 0  | 0  | 1  | 0  | 1  | 0  | 1  | 1  | 1  | 1  | 1  | 1  | 1  | 1  | 1  | 0  | 0  |
| 14 | 1  | 1  | 0  | 1  | 0  | 1  | 1  | 0  | 1  | 1  | 1  | 1  | 1  | 1  | 1  | 1  | 0  | 1  | 0  |
| 15 | 1  | 1  | 1  | 0  | 1  | 1  | 1  | 0  | 1  | 1  | 1  | 1  | 1  | 1  | 1  | 1  | 1  | 1  | 0  |
| 16 | 1  | 1  | 1  | 1  | 0  | 0  | 1  | 1  | 1  | 1  | 1  | 1  | 1  | 1  | 1  | 1  | 1  | 1  | 1  |

FIGURE 5

D/A CONVERTER FOR CURRENT-DRIVEN TYPE SOURCE DRIVER CIRCUIT IN AM-OLED

FIELD OF THE INVENTION

The present invention relates to a source driver circuit of active matrix organic light emitting diode displays (AM-OLED), more specifically, to a digital to analog (D/A) converter for a current-driven type source driver circuit.

BACKGROUND OF THE INVENTION

With rapid advancement of the fabrication technology of thin film transistors, the OLEDs in new generation are widely applied in various portable electronic products for providing more fine images due to the fact it has advantages of high emitting efficiency, fast responding rate, power saving, non-restriction of visible angle, smaller size, less weight, high brightness and all-color images.

Please refer to FIG. 1, the circuit structure 10 of each unit pixel in current-driven type OLED device is shown. When the signal on the scan line is at low potential level, the PMOS transistors P1, P2 and P3 are sequential switched on. Because the transistor P3 connected to the voltage source·Vdd can conduct with the current source 15 on the data line via the transistor P2, the drain current of transistor P3 will be equal to the current $I_{data}$ of the current source 15. For providing the required current $I_{data}$ of the transistor P3, the capacitor 20 connected to the gate of the transistor P3 can be charged to adjust the gate potential of the transistor P3 and to provide a desired Vgs between the gate and the source thereof. Then, when the signal on the scan line is at high potential level, the PMOS transistors P1 & P2 are switched off, and the NMOS transistor N1 is switched on. At this time, the charged capacitor 20 can maintain the potential difference between the gate and the source of transistor P3 at a specific value Vgs, so as to provide a drain current of $I_{data}$ and to drive the light emitting diode 25 to emit light via the conducting NMOS transistor N1.

In general, for providing more harmonizing and uniform colored images, the data current $I_{data}$ on the data line is adjusted to have multiple gray levels. Please refer to FIG. 2, the current source 30 for producing the current with 16 gray levels designed by J. Kanicki is illustrated. The current source 30 comprises four transistors M1, M2, M3 & M4 with the W/L (channel width to channel length) ratio of 1:2:4:8. And the sources of these transistors are all connected to a common voltage source VD0, as to the drains thereof are connected to another transistor DR, so as to have these drains at the potential level of the reference voltage VDR0 when the transistor DR is switched on. The gates of transistors M1~M4 are connected separately to control terminals of VD1, VD2, VD3 and VD4, and switched on or off depending on the voltages of these control terminals. It is noted that because these transistors (M1~M4) have different W/L ratios individually, the drain currents thereof also have the ratio of 1:2:4:8. Thus, by turning on some transistors, the sum of currents $I_{data}$ can has the desired gray level. For instance, when only one transistor M1 is turned on the data current $I_{data}$ is equal to I; and when the M1 & M2 both are turned on, the data current $I_{data}$ is equal to 3I.

However, it is noted that the aforementioned current source has many disadvantages. First, for manufacturing the four transistors with the W/L ratio of 1:2:4:8, it is very important to control precisely the layout dimension of each transistor. Under this condition, any inaccuracy occurring in the process will cause the W/L ratio deviate and have the severe gray level shift. Especially, when more current gray levels are desired, it is necessary to manufacture the transistors with a large W/L ratio, that will cause the layout and design of transistors more difficult. For example, when 32 current gray levels are desired, it is required to fabricate two transistors with 16 times dimension difference, for producing the W/L ratio of 1:2:4:8:16. Second, because so far most LEDs are fabricated on the low temperature poly-silicon substrates, it is difficult to manufacture the thin film transistors that meet the required specifications and parameter due to the affections of the substrate properties.

Under such conditions, the distribution of current gray levels maybe have uneven shift due to the errors of the threshold voltage and mobility of the transistors M1~M4. Especially, as shown in FIG. 2, only four transistors are applied to produce 16 current gray levels, so any one transistor with shift parameters will affect the distribution of the current gray level and the uniform degree of the LED display. Further, as shown in FIG. 1, all pixel devices on the same data line have the currents supplied by one identical set of transistors (M1~M4), therefore these four transistors would degrade very fast so as to cause the threshold voltage and mobility of each transistor change severely and to decrease the uniform degree of the LED displays, and even to alter the gray level of images.

For overcoming the above issues effectively, in some process of fabricating LED displays, the approach of thermometer code current cell decoder is introduced. Please refer to FIG. 3, a set of thermometer code current cell decoder 35 with six bits is illustrated. This thermometer code current cell decoder 35 comprises a column decoder 351, a row decoder 352, and a plurality of current cells 36 arranged in an 8×8 square array form. Each current cell 36 has a local current source 361 and a local decoder 362.

For the aforementioned current cell decoder 35 of six bits, the less signal bit (LSB) D1, D2, & D3 are direct input to the column decoder 351. Because each signal bit possess the binary 0 or 1, eight sets of different column selection signals (C) are produced after the decoding procedures by the column decoder 351. As to the more signal bit (MSB) D4, D, & D6 are input to the row decoder 352, so as to produce eight sets of row selection signals (Ri) after decoding procedures. When these column selection signals Cj or row selection signals Ri are input to the current cell 36, through the logical operating circuits of the local decoder 362, the current source 361 can be decided to turned on or off for outputting current Io. For example, the local decoder 362 can be applied to perform the logical computing of ((Ri and Cj) or Ri+1), for deciding to output the current Io or not.

It is noted that, because each current cell 36 for producing output current Io has the identical current source, the multiple current gray levels can be produced according to the number of conducted current cells. For instance, when fifteen current cells are turned on, the summed data current $I_{data}$ is equal to 15 Io; or when twenty-six current cells are turned on, the data current $I_{data}$ is equal to 26 Io. Thus, the aforementioned issues about uniform degree of displaying images due to the variations of threshold voltage and mobility of the TFTs can be improved. Besides, because it is not applying the current source constitute of the four transistors (M1~M4) to supply the pixels on one identical data line, the operating times of each transistor are reduced considerably, so as to improve the degradation of transistors in the prior art.

However, it is necessary to reserve a considerable large area on the substrate for fabricating a large number of decoders and current cells when the approach of thermometer code current cell decoder is introduced. Especially with the increasing gray-scales of the LED displays (6 bits, 8 bits.), the whole area occupied by the current driven circuit also increase fast proportional to the square of bits. Therefore, the approach still cannot be applied to or satisfy with the displays with higher gray-scales.

Additional, such thermometer code current cell array are operated to conduct the specific number of the local current sources one by one according their arrangement and sequence for producing the desired current gray level. As shown in FIG. 3, when the current of 26 Io is desired, the first twenty-six local current sources are turned on from left to right and from top to bottom in the cells array. Therefore, for the upper half of the current cells in the array, their operating times apparently exceed that of the lower half current cells. For example, the operating times of the first one current cell located at the upper and the left side in the array are about 64 times of that of the last one at the bottom and right side in the array. Thus, after long time operating, the quality and uniform degree of the display still are affected due to the degradation each current cell suffering is very different.

SUMMARY OF THE INVENTION

The prime objective of the present invention is to provide a digital to analog current source for supplying the pixel devices of the current driven OLED display a stable data current.

Another objective of the present invention is to provide a display panel with different local current sources and thermometer code current cell decoder unit cell array.

A D/A converter applied in current driven type source driver circuits for producing the data current with different gray levels is disclosed. The D/A converter comprise the following components. A column decoder is applied to transform input digital control signals (Dx) to column selecting signals (Gj). A row decoder is applied to transform the digital control signals (Dx) to row selecting signals (Ri). A unit cell array has current cells arranged in array form. Each current cell has a local current source and a local decoder, the local current source is chosen from a plurality of current sources having different current intensity, and the local decoder can decode the column selecting signals and the row selecting signals for deciding to switch on or off the local current source thereof. The output currents of all the current cells switched on are summed up to produce the data current with a selected gray level.

It is noted that the different current intensity for the local current source comprise $2^N I$ (I, 2I, 4I . . .), wherein the N is positive integer, and the I is a lowest output current. The current source also can be adjusted to provide I, 2I & 3I depending on the requirements of design and layout. Besides, when the digital control signals (Dx) possess X bits, the number of the current cells is $\leq X^2$. And when the digital control signals (Dx) possess X (X$\leq$3) bits, the unit cell array can produce the data currents with $2^x$ gray levels.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 5 illustrates the 4-bit input control signals (D0~D3), the column selection signals (C1~C3), the row selection signals (R1~R3), and the computing results of the local decoders of all current cells (T1~T9) according to the present invention;

DETAILED DESCRIPTION OF THE PREFERRED EMBODIMENT

The present invention provides a digital to analog converter circuit applied for the active matrix organic light emitting diode (AM-OLED) displays with LTPS (low temperature poly silicon) TFTs and OLED devices. This D/A converter circuit can be applied to transform the digital signals of binary to a set of specific encoded control signals, for controlling multiple current sources with different current intensity, so as to produce various data currents with different gray level. The detailed description is as follows.

Figure 4:
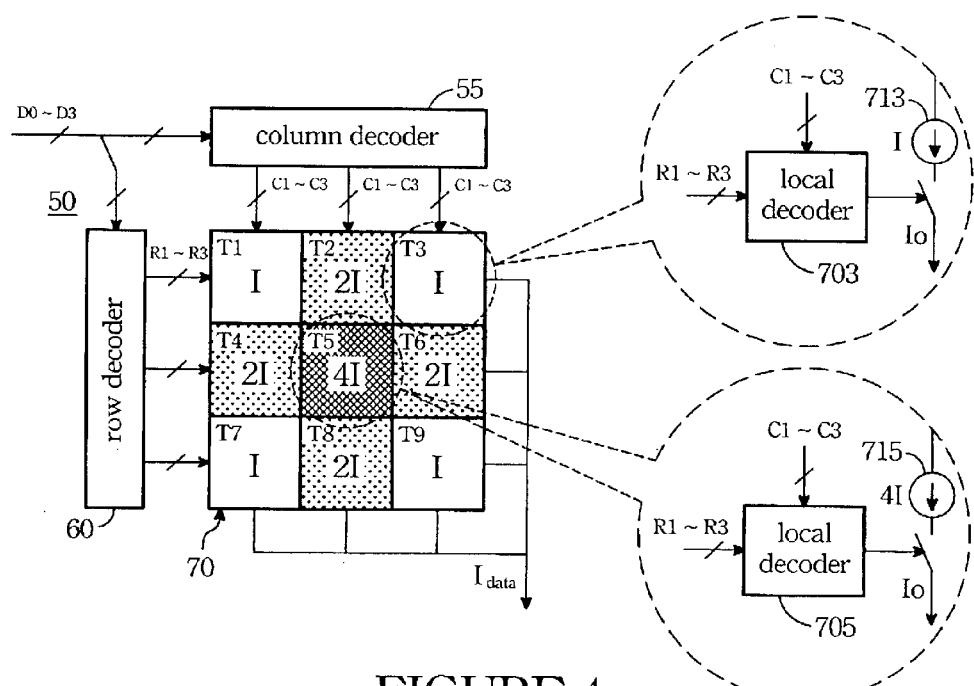
FIG. 4 illustrates the D/A converter for transforming the 4-bit input control signals into the currents with 16 gray levels according to the present invention.

Please refer to FIG. 4, the D/A converter 50 of the present invention is illustrated. It is noted that, in this embodiment, four bits of control signals (D0~D3) are input to the D/A converter 50 for producing the data current with sixteen gray levels. As shown in the FIGURE, the D/A converter 50 comprises a column decoder 55, a row decoder 60 and a unit current array 70. The column decoder 55 can transform the inputted digital control signals (D0~D3; Dx) into a set of column selection signals (C1~C3; Cj) by performing a decoding code. As for the row decoder 60 can transform the inputted digital control signals (D0~D3) into a set of row selection signals (R1~R3: Ri) by executing a decoding code.

As to the unit cell array 70 has a plurality of current cells (T1~T9; Ty) arranged in an array form. Each current cell (Ty) has a specific local decoder and a specific local current source. The local decoder is applied to execute a decoding procedure for the column selections signals (C1~C3) and the row selection signals (R1~R3) input to the current cell, for turning on or off the local current source of the current cell. And the local current source can be applied to produce different output currents (Io). For example, for current cell T3, its local decoder 703 can execute a logical computing according to the decoding code with regards to the input column selection signals (C1~C3) and row selection signals (R1~R3), so as to switch the local current source 713 of current I; and for current cell T5, its local decoder 705 can be applied to switch its local current source 715 of current 4I. As for the current cell T2, its local current source can produce the output current of 2I.

Namely, each current cell (T1~T9) of the unit cell array 70 can have its specific local current source with different current intensity according to the requirement and specifications of circuit design. As illustrated in FIG. 4, the current cell can have its specific local current source with different current intensity I, 2I or 4I. For instance, the current cells T1, T3, T7 and T9 all are equipped the local current sources of current intensity I; and the current cells T2, T4, T6 and T8 are equipped the local current sources of intensity 2I; as to the current cell T5 is equipped the local current source of 4I.

Thus, when the column selection signals (C1~C3) and the row selection signals (R1~R3) are input to the unit cell array 70 and logical computed by each local decoder, the local current sources of some current cells can be turned on, and all the output current (Io) of these current cells are summed up to have the desired data current ($I_{data}$). And this summed data current can have sixteen different gray levels according to conducting conditions of different current cells. For instance, when there are only the local current sources of the current cells T1 & T5 in the unit cell array 70 are turned on, the summed data current is equal to 5I. Similarly, when there are only the local current sources of the current cells T1 & T2 are turned on, the summed data current is equal to 3I. And when all current cells (T1~T9) are turned on, the summed data current is equal to 16I.

It is noted that the devices such as the inverter, "AND" gate, "OR" gate are utilized to constitute the required decoder in the present invention for performing the desired decoding procedures of the aforementioned column decoder 55 & row decoder 60. Please refer to FIG. 5, it illustrates the input 4-bit control signals (D0~D3), the corresponding column selection signals (C1~C3) and row selection signals (R1~R3), and the computing results of each local decoder in all the current cells (T1~T9). The logical computing procedures of the column and row decoders 55 & 60 are as follows:

C1=XD0;
C2=D1*XD0+XD1*D0;
C3=D3+D2+D1*D0;
R1=D3*(XD2*XD1*XD0+D2*D1*D0);
R2=D3;
R3=D3*D2;

Wherein the XD is a complementary signal of D, "*" is AND operator, "+" is OR operator. The local decoder in each current cell can execute the following computing procedures:

T1=C1+C3;
T2=C2+C3;
T3=C3:
T4=R2;
T5=R3:
T6=R2;
T7=C1*C3+R1;
T8-C2*C3+R1;
T9=R1.

Via the above logical computing procedures, the results corresponding to the local decoders are shown in FIG. 5. In 1$^{st}$ situation, when four input control signals all are "0", only the local decoder of the current cell T1 can get the result of signal "1" and conduct the local current source to have the data current of I; and in 2$^{nd}$ situation, when there is only the control signal D0=1, the current cell T2 can get the result of signal "1" and have the data current of 2I; similarly in the 16$^{th}$ situation, all current cells can get signals "1" and have the data current of 16I.

It is noted that the aforementioned logical computing codes of the column and row decoder 55 & 60, and each local decoder are according to one preferred embodiment of the present invention. In actual practice, the logical computing codes can be modified arbitrarily according to the requirement or consideration In circuit layout. Basically, it is permissive if the combinations of computing results of each local decoder and the local current sources thereof can produce the data current with 16 gray levels.

Figure 6:
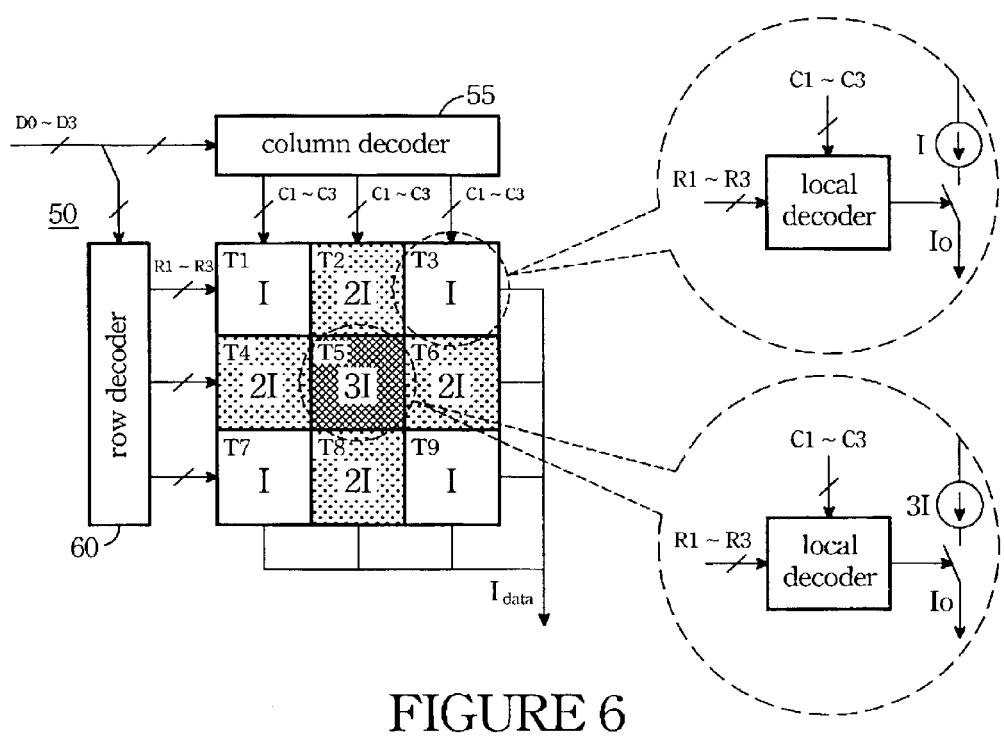
FIG. 6 illustrates the D/A converter has a current cell T5 which can provide the output current of 3I according to the present invention.

Further, even in the embodiment shown in FIG. 4, all the local current sources are divided into three sorts for outputting individually currents of I, 2I or 4I. However, in actual practice, the current intensity of the current sources also can be adjusted according to the consideration and requirement in the circuit layout. For instance, refer to FIG. 6, the local current source of the current cell T5 has the output current of 3I. In other words, the local current sources in the present invention are not limited to have the current intensity of the series of 2 (I, 2I, 4I. . . =2$^N$I, wherein the N is a positive integer), and can be adjusted according to the combinations of local current sources. As to the processes of fabricating the different current sources, as those who skilled in the art known, can be done with various manners, such as adjusting the W/L ratio to control the current ratio equal to 1:2:4.

Figure 7:
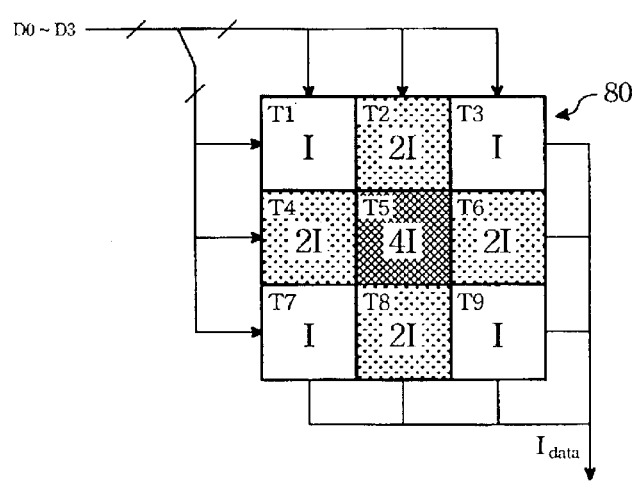
FIG. 7 illustrates the D/A converter without the column and row decoders according to the present invention.

Besides, in FIG. 4, two steps of logical computing procedures are executed by applying the column decoder 55, the row decoder 60 and the local decoders in the unit cell array 70, however, for the consideration of further simplifying the device layout of the display panel, both the column and row decoders can be integrated into the unit cell array. Please refer to FIG. 7, the condition of eliminating the column and row decoders are illustrated. The input binary control signals (D0~D3) are input directly the unit cell array 80, and computed by the local decoder of each current cell for switching some local current sources, so as to sum up the data current with 16 gray levels.

Figure 8:
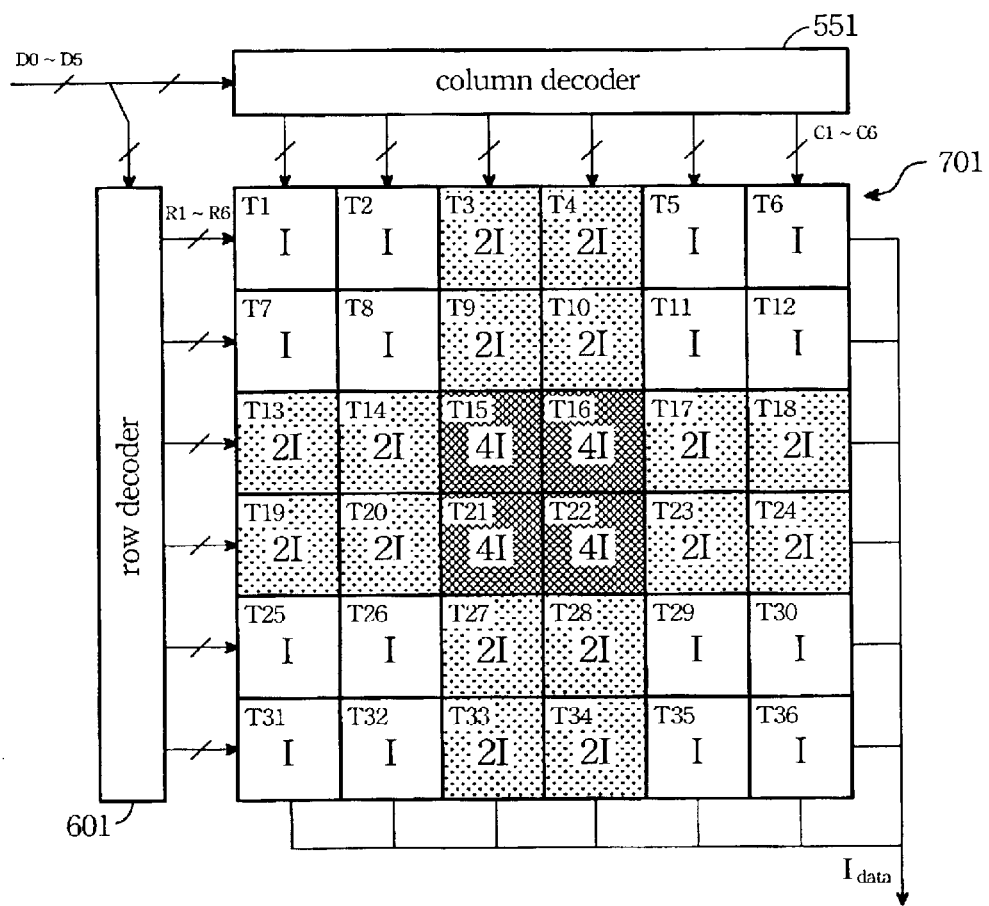
FIG. 8 illustrates the D/A converter for transforming the 6-bit input control signals (D0~D5) into the current of 64 gray levels according to the present invention.

It is noted that, in above embodiment, 4-bit input control signals are applied to produce the sixteen gray level currents. However, the circuit design of the present invention can extend more bits and have more gray levels easily. Please refer to FIG. 8, six bits of input control signals (D0~D5) are input and computed by the column decoder 551 and the row decoder 601 so as to produce the column selection signals (C1~C6) and the row selection signals (R1~R6). These selection signals are input to the unit cell array 701 comprising the thirty-six current cells (T1~T36). As the same, each local current source can be switch on or off via the computing procedures of the local decoder. And the summed data current will have 64 gray levels. In this embodiment, all the current sources, as above, can be divided into three sorts of intensity I, 2I or 4I.

Figure 1:
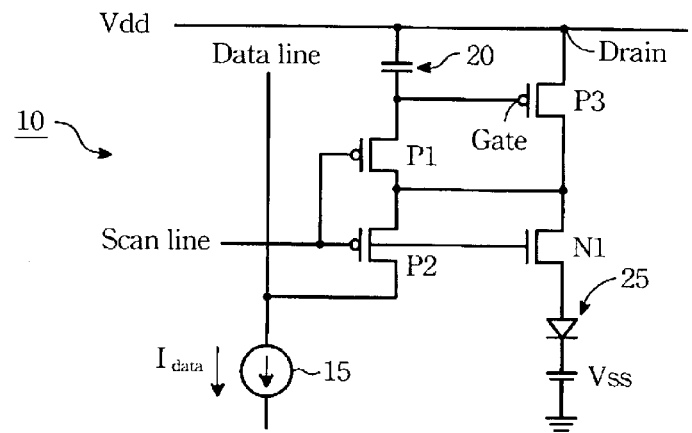
FIG. 1 illustrates the circuit structure of the unit pixel of the current driven type OLED displays in prior art.
Figure 2:
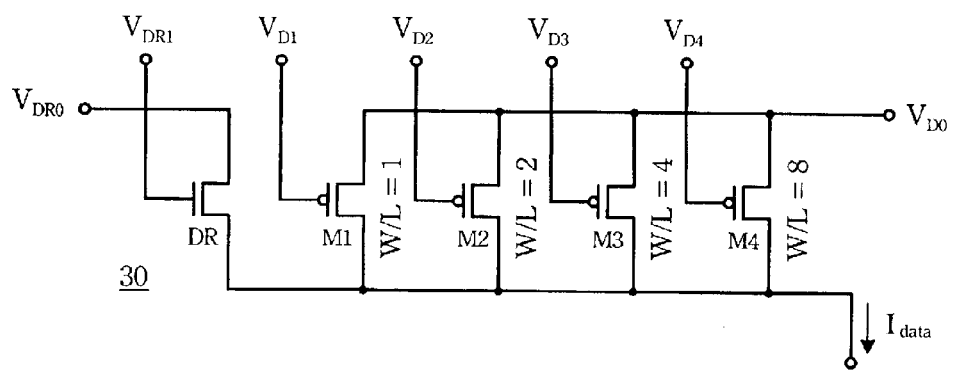
FIG. 2 illustrates the circuit structure of the current sources for producing the data current with 16 gray levels in prior art.
Figure 3:
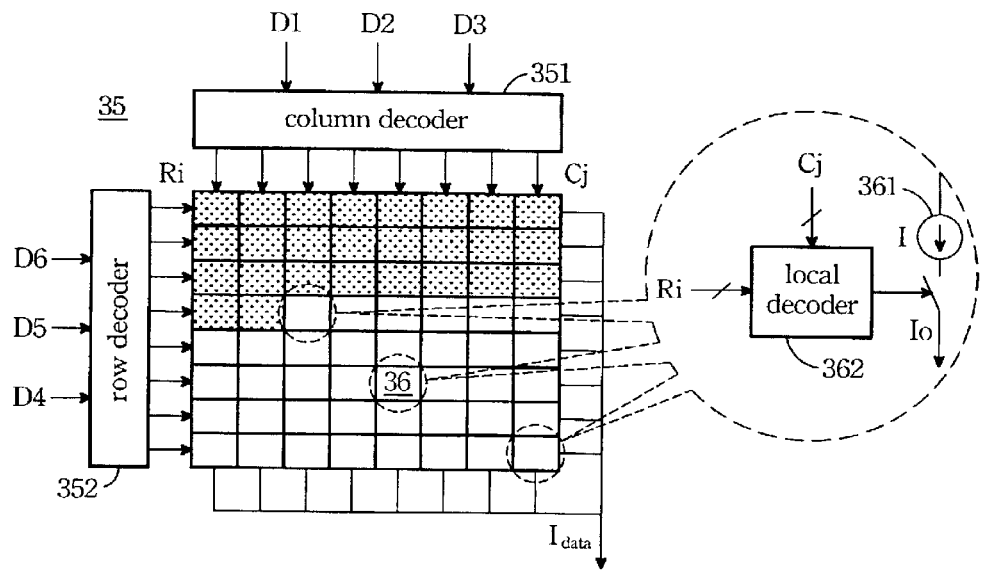
FIG. 3 illustrates the interior circuit structures of the thermometer code current cell decoder for producing the currents with 64 gray levels according to the input 6-bit control signals in prior art.
Figure 9:
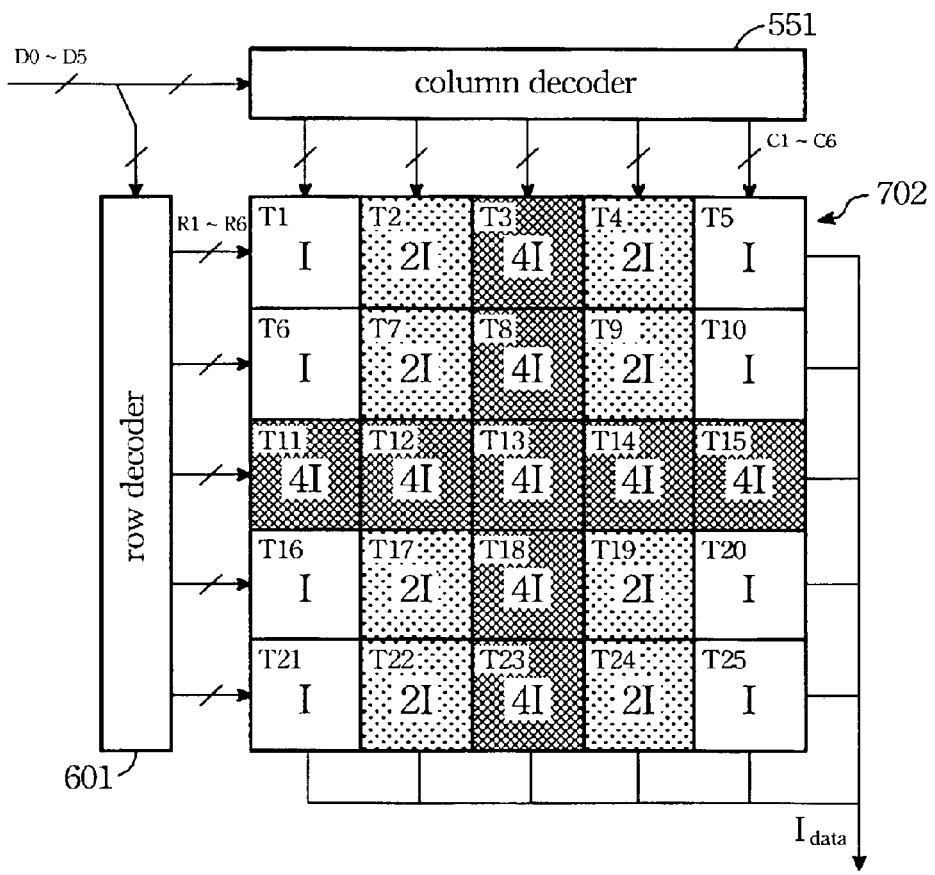
FIG. 9 illustrates the D/A converter with less current cells for transforming the 6-bit input control signals (D0~D5) into the current of 64 gray levels according to the present invention.

Because the desired gray level current in the present invention is to sum up the conducting local current sources with different intensity, the number of the current cells can be further reduced according to the possible summing conditions. Please refer to FIG. 9, the illustration is using 6-bit input control signals (D0~D5) to produce 64 sorts of current gray levels. However, compared to FIG. 8, only twenty-five current cells (T1~T25) are arranged to constitute the unit cell array 702. Even the unit cell array 702 is small than above, it can still produce 64 gray level currents, due to the because there are nine current cells for outputting current of 4I. The logical computing codes of the local decoders are as follows:

Ti=XD0+D1+D20+D3;
T2=D0+D1+D2+D3;
T3=D0*D1+D2+D3;
T4=D3;
T5=D2*D3;
T6=D3;
T7=(D2+D3)*(XD0+D1*XD0+D1*D0);
T8-(D2+D3)*D1*D0;

The converter circuits disclosed in the present invention has considerable advantages: (1) Using multiple local current sources with different current intensity to produce the desired gray level current, so each current cell can be switched on or off via the related decoders to produce $2^N$ gray level currents according to the input N-bit digital control signals. Under this condition, the issues of large area occupied by the thermometer code current cell decoders (as shown in FIG. 3) and increasing fast with the data bits in the prior art are overcome. For example, when the digital control signals has N bits, the number of total current cells in the present invention is still $\leq N^2$; (2) the local current sources of some current cells are switched on to sum up the output current with the desired gray level via the logical computing of the local decoders in the present invention. Therefore, by the design and layout of the local decoders, the operating times of the current cells are generally reduced and maintained equivalent as possible, so as to prevent from the severe degradation differences. Thus, even after a long period of usage, the data currents still have the stable gray level distributions; (3) the uniform degree and image quality of the display panels are improved considerably due to the stable gray levels of currents even a long time of operation.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar design.

What is claimed is:

1. A digital to analog (D/A) converter applied in current-driven type source driver circuits for producing multiple data currents with different gray levels, said D/A converter comprising:
   a column decoder for transforming input digital control signals (Dx) to a set of column selecting signals (Cj);
   a row decoder for transforming said digital control signals (Dx) to a set of row selecting signals (Ri);
   a unit cell array, having a plurality of current cells arranged in array form, wherein each said current cell has a local current source and a local decoder wherein each said local current source provides a plurality of current sources having at least three different current intensities, and said local decoder is decoding said column selecting signals and said row selecting signals for deciding to switch on or off said local current source of said current cell;
   wherein output currents of all said current cells switched on are summed up to produce a data current with a selected gray level,
   wherein said at least three different current intensities for said local current source comprise I, 2I and 3I, wherein said I is an electric current intensity, and
   when said digital control signals (Dx) possess X bits, a number of said current cells of said unit cell array is less than or equal to $X^2$ and said D/A converter produce said data currents representing $2^x$ gray levels when said digital control signals (Dx) process X bits.

2. A unit cell array for producing currents with different gray levels comprising: a plurality of current cells arranged in array form, each said current cell having a local current source and a local decoder, wherein said local current source provides a selected current intensity chosen from at least three different current intensities and said local decoder is decoding selecting signals for deciding to switch on or off said local current source of said current cell, wherein output currents of all said current cells switched on are summed up to produce a data current with a selected gray level, and said at least three current intensities for said local current source comprise I, 2I and 3I, wherein said I is an electric current intensity.

3. A unit cell array fabricated on a display panel, having a plurality of current cells arranged in array form for producing data currents with different gray levels, each said current cell comprising:
   a local current source for providing one selected current intensity chosen from at least three sorts of current intensity wherein said at least three sorts of current intensity for said local current source comprise I, 2I and 3I, wherein said I is an electric current intensity;
   a local decoder for receiving digital control signals (Dx) from data lines and executing a decoding procedure for deciding to switch on or off said local current source for outputting said selected current;
   wherein all outputting currents of each said current cell switched on are summed up to produce a data current with a selected gray level, and
   when said digital control signals (Dx) possess X bits, a number of said current cells of said unit cell array is less than or equal to $X^2$, and said unit cell array can produce said data currents representing $2^x$ gray levels when said digital control signals (Dx) process X bits.

4. A unit pixel circuit for an organic light emitting diode display (OLED) comprising:
   a scan line, for transferring scan signals of said unit pixel;
   a data line, for transferring data signals of said unit pixel:
   an organic light emitting diode, driven by a data current to emit lights;
   a plurality of transistors, connected separately to said scan line, said data line and said organic light emitting diode, for conducting said organic light emitting diode with said data current according to said scan signals; and
   a current source, connected with said data line for providing said data current, wherein said current source has a plurality of current cells arranged in array form, each said current cell having a local decoder and a local current source, wherein all local current sources are classified as three sorts according to different current intensity, and said local decoder performing a decoding procedure for selecting signals which are input to said current cell, so as to decide to switch on or off said local current source of said current cell for providing an output current, wherein output currents of all said current cells switched on are summed up to produce said data current with a selected gray level,
   wherein said different sorts of current Intensity for said local current source comprise $2^N I$, wherein said N is positive integer, and said I is a lowest output current, and
   when said selecting signals possess X bits, a number of said current cells of said unit cell array is less than or equal to $X^2$, and said unit cell array can produce said data currents with $2^x$ gray levels when said digital control signals (Dx) process X bits.

* * * * *